United States Patent
Kotecki et al.

[11] Patent Number: 6,150,230
[45] Date of Patent: Nov. 21, 2000

[54] TRENCH SEPARATOR FOR SELF-DEFINING DISCONTINUOUS FILM

[75] Inventors: David E. Kotecki, Hopewell Junction; William H. Ma, Fishkill, both of N.Y.

[73] Assignee: International Business Machines Corporation, Armonk, N.Y.

[21] Appl. No.: 09/320,533

[22] Filed: May 26, 1999

Related U.S. Application Data

[62] Division of application No. 08/865,529, May 29, 1997.

[51] Int. Cl.[7] .................................................. H01L 21/20
[52] U.S. Cl. ................................... 438/399; 438/253
[58] Field of Search ................................. 438/239, 248, 438/238, 386, 399; 257/296, 399, 386

[56] References Cited

U.S. PATENT DOCUMENTS

| | | | |
|---|---|---|---|
| 5,143,861 | 9/1992 | Turner | 437/52 |
| 5,335,138 | 8/1994 | Sandhu et al. | 361/303 |
| 5,381,302 | 1/1995 | Sandhu et al. | 361/305 |
| 5,392,189 | 2/1995 | Fazan et al. | 361/305 |
| 5,416,042 | 5/1995 | Beach et al. | 437/60 |
| 5,418,180 | 5/1995 | Brown et al. | 437/60 |
| 5,436,477 | 7/1995 | Hashizume et al. | 257/310 |
| 5,478,772 | 12/1995 | Fazan et al. | 437/60 |
| 5,489,548 | 2/1996 | Nishioka et al. | 437/60 |
| 5,504,041 | 4/1996 | Summerfelt | 437/235 |
| 5,506,166 | 4/1996 | Sandhu et al. | 437/60 |
| 5,534,458 | 7/1996 | Okudaira et al. | 437/52 |
| 5,550,076 | 8/1996 | Chen et al. | 437/52 |
| 5,554,564 | 9/1996 | Nishioka et al. | 437/192 |
| 5,776,808 | 7/1998 | Muller et al. | 438/243 |

*Primary Examiner*—Matthew Smith
*Assistant Examiner*—Calvin Lee
*Attorney, Agent, or Firm*—Jay H. Anderson

[57] ABSTRACT

A discontinuous film structure on a substrate, with an etch stop layer on the substrate, a separator layer with an opening formed therein on the etch stop layer and a discontinuous-as-deposited film on the separator layer, the discontinuity substantially in register with the opening. The structure is made into a stacked capacitor with the discontinuous film being the bottom electrode, by forming a continuous dielectric layer on the bottom electrode and a continuous top electrode layer on the dielectric layer.

10 Claims, 2 Drawing Sheets

TRENCH SEPARATOR FOR SELF-DEFINING DISCONTINUOUS FILM

RELATED APPLICATIONS

This appln is a Div of Ser. No. 08/865,529 filed May 29, 1997.

This invention is related to copending U.S. patent applications Ser. No. 09/103,187, titled "Overhanging Separator for Self-Defining Stacked Capacitor," Ser. No. 08/865,534, titled "Adherent Separator for Self-Defining Discontinuous Film", and Ser. No. 08/865,528, titled "Overhanging Separator for Self-Defining Discontinuous Film", all filed on the same day and assigned to the present assignee.

FIELD OF THE INVENTION

This invention is directed to semiconductor films and the manufacture of the same, more particularly to a self-defining discontinuous film, and most particularly to a capacitor employing a self-defining electrode.

BACKGROUND OF THE INVENTION

Capacitor structures using high-dielectric materials such as $(Ba,Sr)TiO_3$ (BST) require noble metal electrodes, such as platinum, which are very difficult to pattern using conventional semiconductor processing such as reactive ion etching (RIE), ion beam etching, or chemical-mechanical polishing (CMP). Therefore there is a need for a capacitor structure which does not require a separate patterning step to define the electrodes.

Furthermore, the use of high dielectric constant materials enables a reduction in capacitor area while maintaining the desired charge storage density. In order to minimize cell area, the unusable space (i.e. the separation between adjacent capacitors) should be kept as small as possible.

For purposes of this invention, the term "oxide" layer is used generally to refer to a layer of silicon dioxide, and the silicon dioxide may be undoped or doped, for example, with boron, phosphorous, or both, to form for example borophosphosilicate glass (BPSG), and phosphosilicate glass (PSG). The silicon dioxide layers may be grown or deposited by conventional techniques.

SUMMARY OF THE INVENTION

It is therefore an object of the present invention to provide a capacitor structure which does not require a separate patterning step to define the electrodes.

It is a further object to provide a structure which is useful for forming a discontinuous film in one process step.

It is a further object to provide such a structure which maximizes capacitor area while minimizing cell area.

In accordance with the above listed and other objects, a discontinuous film structure is provided on a substrate, with an etch stop layer on the substrate, a separator layer with an opening formed therein on the etch stop layer and a discontinuous-as-deposited film on the separator layer, the discontinuity substantially in register with the opening. The structure is made into a stacked capacitor with the discontinuous film being the bottom electrode, by forming a continuous dielectric layer on the bottom electrode and a continuous top electrode layer on the dielectric layer.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

The present invention is described herein in the context of a stacked capacitor merely as a specific example, and is not meant to limit applicability of the invention to such. Those skilled in the art will understand that the invention is broadly applicable to any structure or method in which it is desirable to have a self-defining discontinuous film structure on a substrate, with an etch stop layer on the substrate, a separator layer with an opening formed therein on the etch stop layer and a discontinuous-as-deposited film on the separator layer, the discontinuity substantially in register with the opening.

Figure 1A:
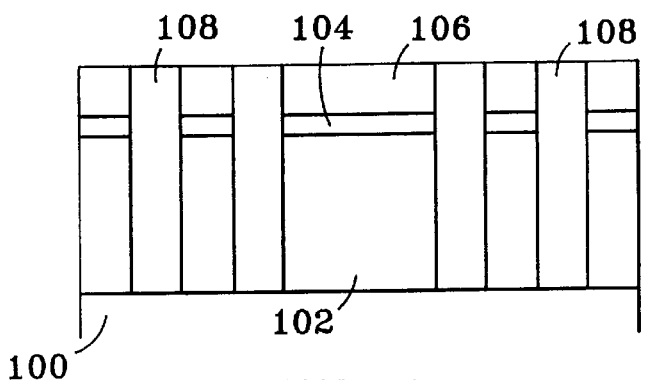
FIGS. 1a–1g are sectional views of the processing steps to manufacture the capacitor structure, all in accordance with the present invention.

In FIG. 1a, a substrate 100 has formed thereon a first layer of oxide 102, an etch stop layer 104, and a second layer of oxide 106. Etch stop layer 104 is any material that oxide 106 will selectively etch to, for example silicon nitride. The stack of layers has been patterned to form contact plugs 108. Plugs 108 are a conductive material, for example in-situ doped polysilicon, tungsten, titanium, or various suicides including tungsten and titanium silicides, and may be deposited for example by low pressure chemical vapor deposition (LPCVD) followed by planarization. Note that for certain applications of the capacitor structure to be formed, other circuit elements such as word line and bit line contacts may be fabricated prior to and below the capacitor, within substrate 100, oxide 102, or oxide 106. Note also that plugs 108 are not required for all applications of the structure.

Figure 1B:
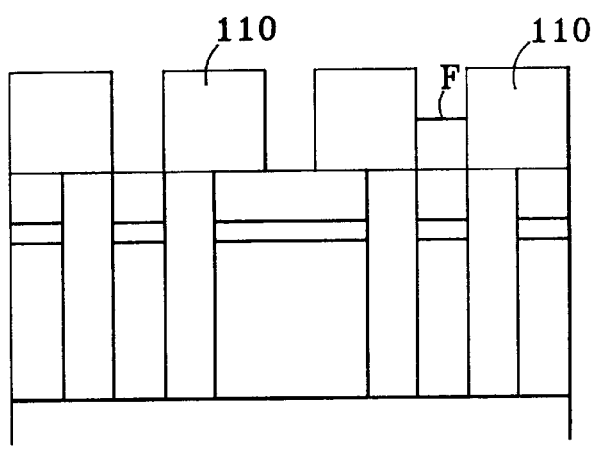

In FIG. 1b, a disposable layer has been formed on oxide layer 106 and patterned to form isolated pads 110. The disposable layer may be any material which is selectively etchable with respect to oxide 106, in this instance, because plugs 108 are not exposed by the patterning process. A suitable material for the disposable layer is $SiO_2$ or a stack of oxide/nitride. Pads 110 are separated by a distance of at least F, where F is the minimum dimension achievable using lithography.

Figure 1C:
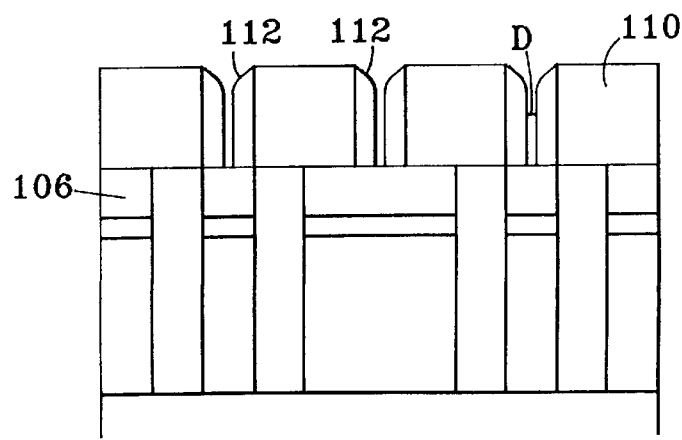

In FIG. 1c, sidewalls 112 are formed on pads 110 using conventional deposition and etching techniques. Sidewalls 112 may be for example amorphous or polycrystalline silicon, or silicon nitride. Adjacent sidewalls are thus separated by a distance D which is less than 0.5F.

Figure 1D:
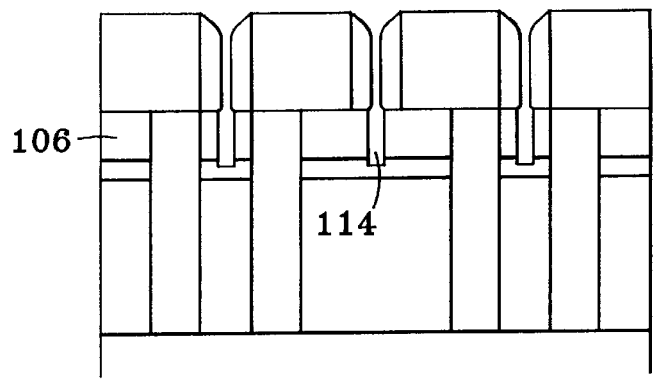

Oxide 106 is then etched down to etch stop layer 104 using pads 110 and sidewalls 112 as a mask in FIG. 1d, forming trenches 114 in oxide 106. Trenches 114 have a width of D'. A suitable etch process is a directional one, for example reactive ion etching (RIE). Pads 110 and sidewalls 112 are then removed for example by planarization, dry etching, or wet etching.

Figure 1E:
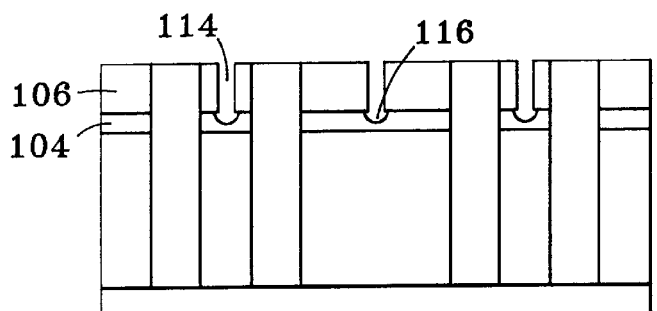

In FIG. 1e, an isotropic etch may be optionally used to form small cavities 116 in etch stop layer 104. A suitable process for this step is a high-pressure plasma or wet chemical treatment.

Figure 1F:
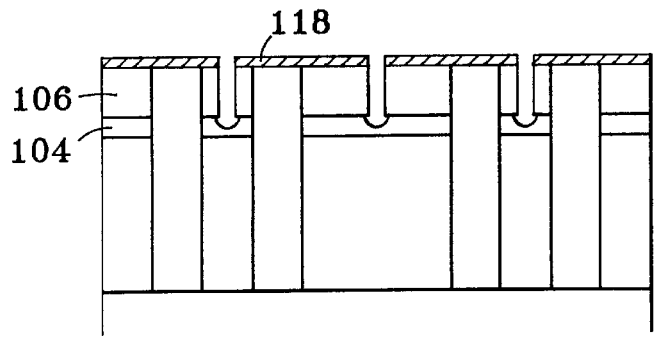

In FIG. 1f, a thin film 118 is deposited on oxide 106 and plugs 108 for example by physical vapor deposition. Film 118 optimally has a thickness less than or equal to ½ D' so that trenches 114 will not fill completely.

Figure 1G:
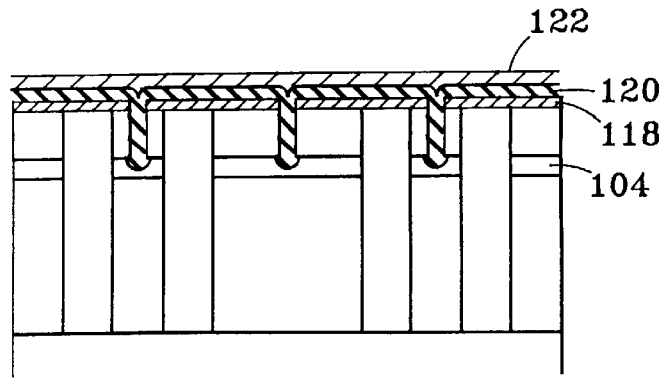

Film 118 may be used as the bottom electrode in a stacked capacitor. Bottom electrode 118 may be for example Pt, Ir, Pd, or $IrO_2$ and is preferably a noble metal or noble metal oxide for high dielectric constant capacitor applications. The capacitor is completed by forming a dielectric layer 120 followed by a top electrode layer 122 as shown in FIG. 1g.

Layer 120 may be any suitable capacitor dielectric, and preferably one with a high-dielectric constant material (i.e. with a dielectric constant over 20) such as $(Ba,Sr)TiO_3$ (BST). Top electrode 122 is preferably from the same group of materials as bottom electrode 118.

It is important to note that film 118 is discontinuous, and that the discontinuity is caused by trenches 114 in oxide layer 106 and optional cavities 116 in etch stop layer 104. Oxide layer 106 may thus be called a trench separator layer as it serves to separate adjacent capacitors. Film 118 can also be characterized as non-patterned, or discontinuous-as-deposited. Even though some material may be deposited within trenches 114, adjacent capacitors are prevented from shorting together. Thus the bottom electrode is self-forming or self-defining.

In summary, a capacitor structure is provided which does not require a separate patterning step to define the bottom electrode. More generally, a structure is provided which is useful for forming a discontinuous film in one process step, and is thus feasible for routine semiconductor manufacturing. The separation between adjacent capacitors is minimized, and can be less than ½ the minimum achievable lithographic dimension.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for making a discontinuous film structure on a substrate, comprising the steps of:

forming an etch stop on the substrate;

forming a separator on the etch stop, the separator having a trench with a first width formed therein down to the etch stop layer, the separator being formed by
   forming a separator layer on the etch stop, forming a disposable mask layer on the separator layer, patterning the disposable layer to form sidewalls spaced a first distance apart, and using the disposable layer and sidewalls as a mask to etch the trench; and forming a discontinuous-as-deposited film on the separator, the discontinuity substantially in register with the trench.

2. The method of claim 1 wherein the structure is a capacitor, and the discontinuous film is a bottom electrode of the capacitor, further comprising the steps of:

forming a continuous dielectric layer on the bottom electrode; and forming a continuous top electrode layer on the dielectric layer.

3. The method of claim 2 wherein the bottom electrode is a material selected from the group consisting of noble metals and noble metal oxides.

4. The method of claim 3 wherein the bottom electrode is platinum.

5. The method of claim 2 wherein the dielectric layer is a high-dielectric constant material.

6. The method of claim 5 wherein the dielectric layer is $(Ba,Sr)TiO_3$.

7. The method of claim 2 further comprising the step of forming a contact plug extending from the substrate through the etch stop and separator layer to contact the discontinuous-as-deposited film.

8. The method of claim 1 wherein the first width is greater than or equal to half the thickness of the film.

9. The method of claim 1 further comprising the step of forming extension of the trench into the etch stop layer, the extension having a second width greater than the first width of the trench.

10. The method of claim 1 wherein the discontinuous-as-deposited film is formed by physical vapor deposition.

* * * * *